United States Patent [19]

Nakabayashi

[11] Patent Number: 4,771,402
[45] Date of Patent: Sep. 13, 1988

[54] ADDRESS COMPARATOR

[75] Inventor: Takeo Nakabayashi, Itami, Japan

[73] Assignee: Mitsubishi Denki Kabushiki Kaisha, Tokyo, Japan

[21] Appl. No.: 860,626

[22] Filed: May 6, 1986

[30] Foreign Application Priority Data

May 14, 1985 [JP]  Japan ................................ 60-104348

[51] Int. Cl.⁴ ............................................. G06F 12/00
[52] U.S. Cl. ..................................................... 364/900
[58] Field of Search ... 364/200 MS File, 900 MS File

[56] References Cited

U.S. PATENT DOCUMENTS

| 4,159,535 | 6/1979 | Fuhrman | 364/900 |
| 4,171,538 | 10/1979 | Sheller | 364/900 |
| 4,175,287 | 11/1979 | Fuhrman | 364/900 |
| 4,327,411 | 4/1982 | Turner | 364/900 |

Primary Examiner—Thomas M. Heckler
Attorney, Agent, or Firm—Lowe, Price, Leblanc, Becker & Shur

[57] ABSTRACT

An address comparator compares a write address value and a read address value for designating addresses in an elastic store circuit. More specifically, the count output of a write address counter (20) for counting a write clock signal is decoded by a write address decoder (30) and the count output of a read address counter (50) for counting a read clock signal is decoded by a read address decoder (40). The respective decoded outputs are classified into a plurality of groups so as to be supplied to a logical circuit group (10). The logical circuit group (10) provides a signal for giving an alarm when the output address value of the write address counter (20) is applied in a predetermined number of address groups including as the center the address group to which the output address value of the read address counter (50) belongs. With such arrangement, a timing difference between a write address value and a read address value can be always observed and even if the timing difference is changed rapidly, the timing difference entering the alarm zone can be detected.

5 Claims, 2 Drawing Sheets

ADDRESS COMPARATOR

BACKGROUND OF THE INVENTION

1. Field of the Invention

This invention relates to an address comparator. More particularly, this invention relates to an address comparator for comparing a write address value and a read address value in an elastic store circuit where a write address counter and a read address counter are provided independently and writing and reading of data can be performed independently and simultaneously.

2. Description of the Prior Art

The LSI technology is recently remarkably developed and introduction of LSI makes it possible to manufacture small-sized digital communication apparatus at low cost. Particularly, synchronous multiplex converting apparatus in a digital network serves to multiplex and insert a lower group of signals into a higher group of signals or to multidrop a higher group of signals to a lower group of signals. In such a digital network, there is provided an elastic store circuit having a function of absorbing a jitter in the transmission line and a change in delay and a function of synchronizing with the station frame phase.

Such an elastic store circuit has been already disclosed in Electric Communication Journal (September, 1980, Vol. J63-CNo. 9) by Hideki Fukuda et al. and in connection with an elastic store circuit, Japanese patent applications were filed (Japanese Patent Laid Open Gazette No. 53935/1980 and Japanese Patent Laid Open Gazette No. 64934/1979).

FIG. 1 is a schematic block diagram of an elastic store circuit. First, referring to FIG. 1, a construction and an operation of an elastic store circuit will be described. A write clock signal is supplied to a write address counter 1. The write address counter 1 counts a write clock signal and supplies the count output as a write address signal to a write address decoder 2 and an address comparator 4. The write address decoder 2 decodes the write address signal and supplies the write address decode signal to a store cell 3. Then, data is written in an address designated by the write address decode signal of the store cell 3.

On the other hand, to a read address counter 5, a read clock signal different from the write clock signal is supplied. The read address counter 5 counts the read clock signal and supplies the count output as a read address signal to a read address decoder 6 and the address comparator 4. The read address decoder 6 decodes the read address signal and supplies the read address decode signal to the store cell 3. Thus, data is read out from the store cell 3 of the address designated by the read address decode signal.

As described above, in the elastic store circuit, the write signal and the clock signal are independently applied. As a result, the elastic store circuit has advantageous features that change in phase at the time of writing data can be absorbed, an output without phase change can be obtained at the time of reading data and the writing speed and the reading speed can be changed and data can be multiplexed.

However, if in such an elastic store circuit, the output address values of the write address counter 1 and the read address counter 5 become near each other, there is a fear of erroneous operation such as rewriting of data in the address where reading is not completed or rereading of data in the address where the old data which should be already read out remains. For the purpose of preventing such erroneous operation, the address value of the write address counter 1 and the address value of the read counter 5 are compared by the address comparator 4 so that an alarm is issued when the difference between the address values of the write address counter 1 and the read address counter 5 is smaller than a predetermined value.

FIG. 2 is a block diagram of the address comparator shown in FIG. 1. In FIG. 2, the address comparator 4 comprises a write reset timing signal detecting portion 7, a read reset timing signal detecting portion 8, a timing difference setting portion 9 and a timing comparing portion 11. The write reset timing signal detecting portion 7 receives the count output of the write address counter 1 and the read reset timing signal detecting portion 8 receives the count output of the read address counter 5. The write reset timing signal detecting portion 7 detects timing for resetting the write address counter 1 by a write address counter reset signal and the read reset timing signal detecting portion 8 detects timing for resetting the read address counter 5 by a read address counter reset signal.

The detection signal of the write reset timing signal detecting portion 7 and the detection signal of the read reset timing signal detecting portion 8 are supplied to the timing comparing portion 11. To the timing difference setting portion 9, a setting signal is supplied from the exterior and an output of the timing difference setting portion 9 is supplied to the timing comparing portion 11. The timing comparing portion 11 provides an output signal when the difference between the write reset timing detected by the write reset timing signal detecting portion 7 and the read reset timing detected by the read reset timing signal detecting portion 8 is smaller than the value set by the timing difference setting portion 9.

Now, an operation of the address comparator 4 will be specifically described. Assuming that the storage capacity of the store cell 3 shown in FIG. 1 has N address positions (N being positive integer), the write address counter 1 and the read address counter 2 are also formed by modulo-N counters. When the write clock signal is supplied to the write address counter 1 by one pulse, the count output thereof increases by one. Similarly, when the read clock signal is supplied to the read address counter 5 by one pulse, the count output increases by one. Then, when the write address counter reset signal or the read address counter reset signal is applied in the state in which the count value of the write address counter 1 and that of the read address counter 5 are respectively $N-1$, these counters 1 and 5 are reset and the count values thereof return to zero. On the other hand, at the time of initialization, the write address counter 1 is initialized by the write address counter reset signal and the read address counter 5 is initialized by the read address counter reset signal so that the initial count values thereof are respectively zero.

The cycle of the write clock signal is generally not equal to the cycle of the read clock signal and besides, there is a change in the cycle of the write clock signal itself. Accordingly, the difference between the output address value of the write address counter 1 and the output address value of the read address counter 5 is generally varied at all times. If this difference becomes smaller than the singal set in the timing difference setting portion 9 from the exterior, the timing comparing portion 11 provides an output signal to issue an alarm.

More specifically, the write reset timing signal detecting portion 7 detects the reset timing for the write address counter 1 and the read reset timing signal detecting portion 9 detects the reset timing for the read address counter 1 whereby a timing difference therebetween is detected by the timing comparing portion 11. If the timing difference detected by the timing comparing portion 11 is smaller than the value set in the timing difference setting portion 9, an output singal is provided to give an alarm.

The set value of the timing difference setting portion 9 is set by the user of this apparatus from the exterior. The value to be set is usually determined by selecting one value out of four values predetermined in view of the characteristics of the write clock signal, the read clock signal and the like.

A conventional address comparator constricted as described above involves no problem in so far as the cycle of the write clock signal and that of the read clock signal are coincident. However, if the cycle of the write clock signal and that of the read clock signal are different as in the case where the elastic store circuit is utilized for speed selection, it sometimes happens that the write address by the write clock signal and the read address by the read clock signal come near. Consequently, the above described error in writing or reading of data might occur. For the purpose of avoiding such error, it is necessary to control the timing of reading and writing by using a controller or the like.

In addition, although in a conventional elastic store circuit, the timing difference between the write reset timing signal and the read reset timing signal is detected, a timing difference between a write address and a read address at the time other than that of resetting the write address counter 1 and the read address counter 5 cannot be known. If a write address and a read address approach each other as a result of a difference caused between the cycles of the clock signals, such approach cannot be detected.

SUMMARY OF THE INVENTION

Therefore a principal object of the present invention is to provide an address comparator in which the difference between a write address and a read address is always observed and if the timing difference is rapidly changed as in the case of using an elastic store circuit for speed selection, the timing difference can be detected and an alarm can be issued if necessary.

Briefly stated, in the present invention, a write address of a store circuit is designated based on the count output of a write address counter and a read address of the store circuit is designated by the count output of a read address counter. The write addresses and the read addresses in the store circuit are divided into a plurality of address groups and in each of the divided address groups, detection is made by logical means as to whether a write address value exists in a predetermined number of address groups including as the center the address group to which a read address value belongs.

Consequently, according to the present invention, by detection as to whether a write address value exists in a predetermined number of address groups including as the center the address group to which a read address value belongs, the write addresses and the read addresses can be always observed and when both addressses approach within a predetermined range, an alarm can be issued immediately. Therefore, if a timing difference is rapidly changed as in the case of using an elastic store circuit for speed selection, an alarm can be given without fail.

According to a preferred embodiment of the present invention, a write address counter, a read address counter, a store circuit, address dividing means and logical means are formed on one chip. As a result, an apparatus using the inventive address comparator can be made to have a small size.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
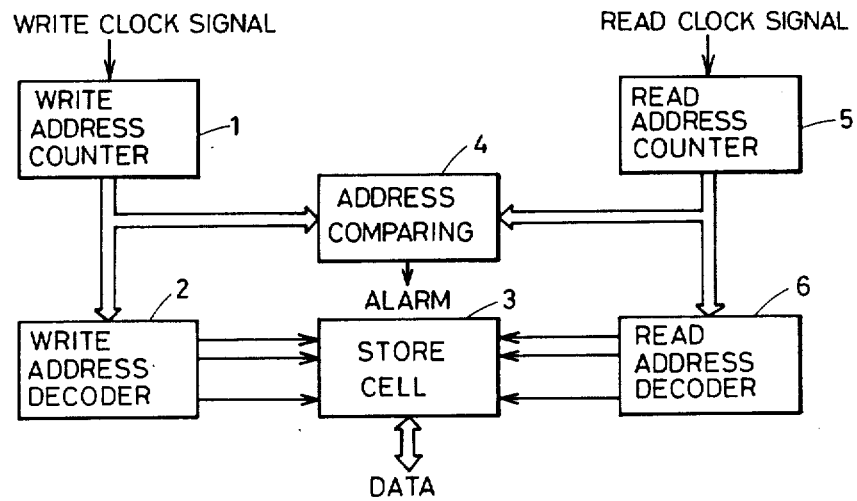
FIG. 1 is a block diagram showing a conventional elastic store circuit.
Figure 2:
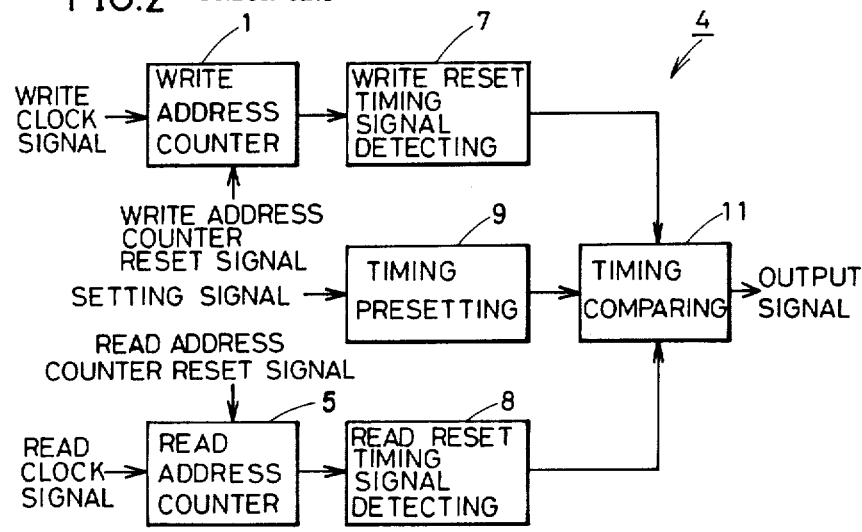
FIG. 2 is s a block diagram of the address comparator shown in FIG. 1.
Figure 3:
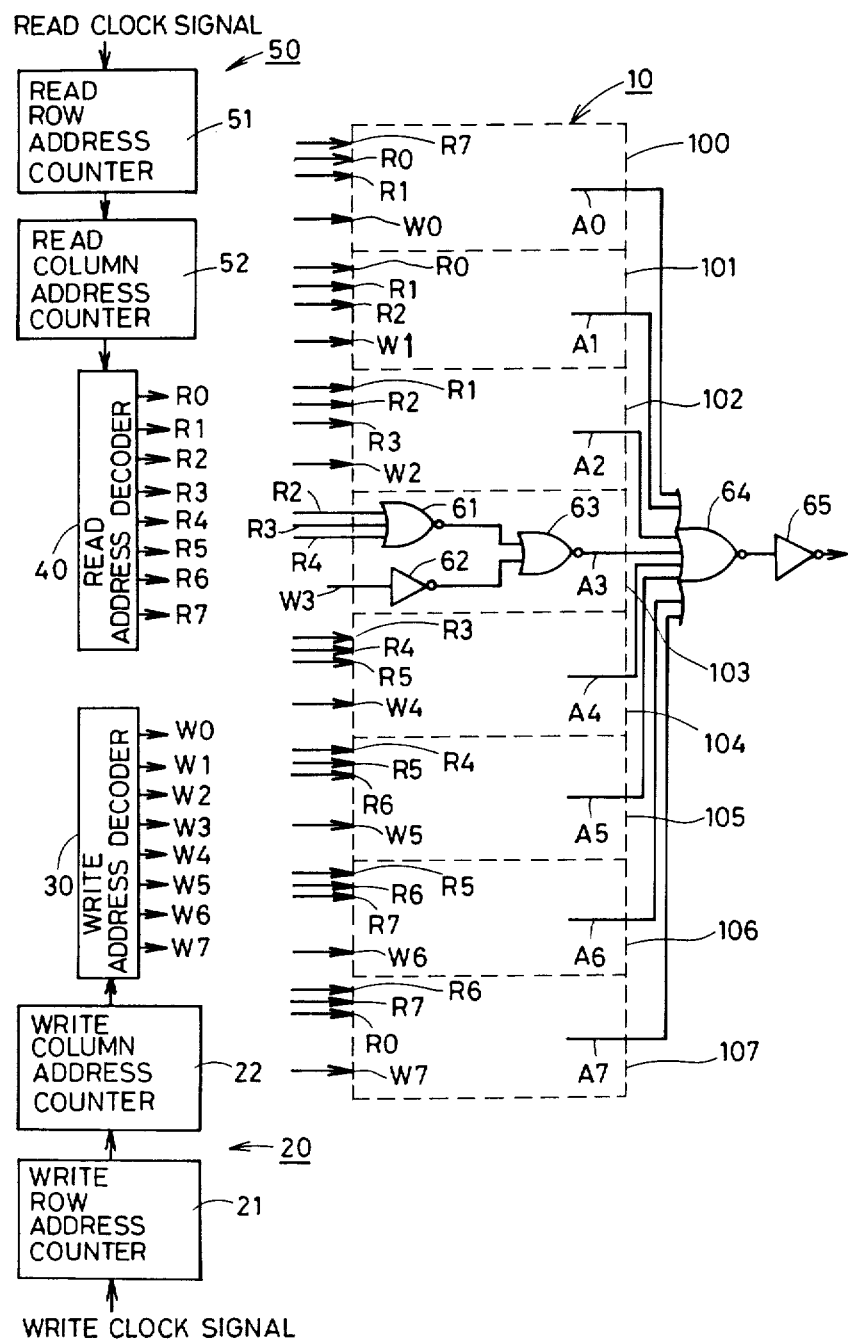
FIG. 3 is a block diagram of an embodiment of the present invention.

FIG. 3 is a block diagram of an embodiment of the present invention. First, referring to FIG. 3, a construction of this embodiment will de described. A write address counter 20 comprises a write row address counter 21 and a write column address counter 22. To the write row address counter 21, a write clock signal is supplied and the write row address counter 21 counts this write clock signal so as to designate a write row address in a store cell 3 as described above in connection with FIG. 1, based on the count output. Assuming that the modulo of the write row address counter 21 is N, the write row address counter 21 generates a carry pulse upon receipt of N write clock signals and supplies the carry pulse to the write column address counter 22. The write column address counter 22 designates a write column address in the store cell 3. The write column address counter 22 counts the carry pulse supplied from the write row address counter 21 and provides the count output to the write address decoder 30. The write address decoder 30 provides write address decode signals W0 to W7.

On the other hand, a read address counter 50 comprises a read row address counter 51 and a read column address counter 52. The read row address counter 51 designates a read row address in the store cell 3 and the read column address counter 52 designates a read column address in the store cell 3. To the read row address counter 51, a read clock signal is supplied. In the same manner as in the write row address counter 21, the read row address counter 51 provides a carry pulse to the read column address counter 52 upon receipt of N read clock signals assuming that the modulo thereof is N. The count output of the read column address counter 52 is supplied to the read address decoder 40. The read address decoder 40 provides read decode signals R0 to R7. The write address decode signals W0 to W7 provided from the write address decoder 30 and the read address decode signals R0 to R7 provided from the read address decoder 40 are supplied to a logical circuit group 10.

The logical circuit group 10 comprises eight cells 100 to 107. The cells 100 to 107 all have the same structure. In FIG. 3, only the cell 103 is shown specifically. The cell 103 comprises NOR gates 61 and 63 and an inverter 62. The write address decode signals W0 to W7 from the write address decoder 30 and the read address decode signals R0 to R7 provided from the read address decoder 40 are respectively classified into groups. The NOR gate 61 of the cell 103 receives the read address decode signals R2, R3 and R4 and the inverter 62 receives the write address decode signal W3. In the same manner, the cells 100 to 102 and 104 to 107 receive respectively the write address decode signals W0 to W7 and the read address decode signals R0 to R7 grouped as described above.

The cell 103 provides an "H" signal from the NOR gate 63 when any one of the read address decode signals R2, R3 and R4 is applied thereto and the write address decode signal W3 is applied thereto. In the same manner, the cells 100 to 102 and 104 to 107 each provide a signal when any one of the three read address decode signals as shown in FIG. 3 is applied thereto and one of the write address decode signals is applied thereto. The output signals provided from the respective cells 100 to 107 are provided through the NOR gate 64 and inverted by the inverter 65 so as to be provided as an alarm signal.

Now, an operation of this embodiment of the present invention will be specifically described in the following. Assuming that the modulo of the write row address counter 21 is N and that the modulo of the write column address counter 22 is M, the write address counter 20 provides address signals of M N addresses (0, 0) to (N−1, M−1) addresses. The read address counter 50 provides address signals similarly. At the time of initialization, when both of the write address counter 20 and the read address counter 50 are reset and N write clock signals are applied to the write row address counter 21, the count output of the write row address counter 21 is returned from (N−1) to 0 and a carry pulse is generated. This carry pulse is applied to the write column address counter 21 as a clock signal, so that the count output of the write column address counter is changed from 0 to 1. Thus, when M N write clock signals are supplied to the write row address counter, the count output of the write row address counter 21 returns from (N−1) to 0 and the carry pulse generated at this time as the count output of the write column address counter 22 returns from (M−1) to 0. The read address counter 50 operates in the same manner as in the above described write address counter 20, based on the read clock signals.

In this invention, the addresses of the store cell 3 are divided into a plurality of address groups in the order of address values and therefore, it is most convenient to select the unit of the division to be within the change of the content of the row address from 0 to (N−1) (in this period, the content of the column addresses being fixed). By dividing the addresses as described above, M address groups each including N addresses can be obtained.

FIG. 3 shows an example of M=8 for the purpose of simplification, where it is indicated that the address group the output address value of the write column address counter 22 belongs to is determined dependent on which signal out of the write address decode signals W0 to W7 has the signal logic "1".

In the same manner, it is indicated that dependent on which signal out of the read address decode signals R0 to R7 of the read address decoder 40 has the logic "1", the address group the output address value of the read column address counter 52 belongs to is determined.

More specifically, when the write address decode signal W3 has the logic "1", and when any of the read address decode signal R3, R2 and R4 and the logic "1", the output signal A3 has the logic "1" and a signal of the logic "1" is provided from the inverter 65. It is the same with the connection of the cells 100 to 107 shown in FIG. 3 if consideration is made on the basis of the read addresses. More specifically, when the read address decode signal R3 has the logic "1", the output signal A3 has the logic "1" if the write address decode signal W3 has the logic "1"; the output signal A2 has the logic "1" if the write address decode signal W2 has the logic "1"; and the output signal A4 has the logic "1" if the write address decode signal W4 has the logic "1". In any of the above described cases, a signal of the logic "1" is provided from the inverter 65.

In consequence, the logical circuit group 10 shown in FIG. 3 is able to issue an alarm by detecting the existence of an output address value of the write address counter 20 in the three address groups including as the center the address group an output address value of the read address counter 40 belongs to.

In the above described embodiment, grouping of the addresses is made according to the values of the column addresses. This grouping corresponds to the case in which the store cells 3 are arranged in a matrix. If the store cells 3 are arranged sequentially, other grouping can be made by selecting the modulo N of the write row address counter 21 and that of the read row address counter 52 to be N=1.

In addition, although in the example shown in FIG. 3, the three read address decode signals R2, R3 an R4 are applied to the inverter 62 with the read address decode signal R3 corresponding to the write address decode signal W3 being the center, any number of address groups may be applied with the center of the read address decode signal R3.

As described above, in this embodiment, the logical circuit group 10 is made to detect the existence of an output address value of the write address counter 20 in the three address groups including as the center the address group an output address value of the read address counter 50 belongs to, and accordingly, when the difference between the write address value and the read address value approaches within a predetermined range, an alarm can be immediately issued. Thus, even if the timing difference is rapidly changed as in the case of using an elastic store circuit for speed selection, an alarm can be given without fail.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An address comparator comprising:
    a write address counter for providing an output address value changing successively each time said write address counter counts a first clock pulse,
    a read address counter for providing an output address value changing successively each time said read address counter counts a second clock pulse,
    a memory circuit coupled to said write and read address counters for storing write and read addresses therein corresponding to output values of said counters, respectively; and logic means coupled to said memory circuit for partitioning the write addresses and the read addresses of said memory circuit successively applied thereto into a plurality of address groups, each of said address groups comprising a sequence of addresses, and for determining if an output address value of said write address counter exists in a predetermined number of address groups that include address values close to an output address value of said read address counter.

2. An address comparator in accordance with claim 1, wherein said write address counter, said read address counter, said memory circuit and said logic means are formed by one chip as an integrated circuit element.

3. An address comparator in accordance with claim 1, wherein said logic means comprises:

a read address decoder having a plurality of output lines corresponding respectively to said address groups and means responsive to a read address counter output address value for outputting a logic signal on a corresponding one of said plurality of output lines, a write address decoder having a plurality of output lines corresponding respectively to said address groups and means responsive to a write address counter output address value for outputting a logic signal on a corresponding one of said plurality of output lines, and combinational logic means responsive to a logic signal on a write address decoder output line and any of a corresponding plurality of read address output lines to output an alarm signal.

4. An address comparator in accordance with claim 3, wherein said corresponding plurality of read address output lines comprises three read address output lines.

5. An address comparator for detecting the proximity of a write address value to a read address value for use with a memory device, said memory device having a plurality of memory cells, each of said cells addressable by a row address together with a column address, said address comparator comprising:

a write address counter for providing an output address value changing successively each time said write address counter counts a first clock pulse, a read address counter for providing an output address value changing successively each time said read address counter counts a second clock pulse, a store circuit coupled to said write address counter and to said read address counter for storing a write address value and a read address value in accordance with output values of said counters, respectively;

a write address decoder for outputting a signal corresponding to a write column address portion of said stored write address value, a read address decoder for outputting a signal corresponding to a read column address portion of said stored read address value, and an alarm circuit for outputting an alarm signal when said write column address portion signal corresponds to any one of a predetermined number of column address portion signals corresponding to address values close to said read column address portion.

* * * * *